United States Patent [19]

Fukuyama et al.

[11] Patent Number: 4,551,640
[45] Date of Patent: Nov. 5, 1985

[54] DUAL ELECTRONIC SWITCHING DEVICE WITH REDUCED EXTERNAL TERMINALS

[75] Inventors: Toshifumi Fukuyama, Kyoto; Kiyohide Okamoto, Otsu, both of Japan

[73] Assignee: Omron Tateisi Electronics Co., Kyoto, Japan

[21] Appl. No.: 672,171

[22] Filed: Nov. 19, 1984

Related U.S. Application Data

[63] Continuation of Ser. No. 597,561, Apr. 6, 1984, abandoned, which is a continuation of Ser. No. 274,074, Jun. 16, 1981, abandoned.

[30] Foreign Application Priority Data

Jun. 16, 1980 [JP] Japan ................................ 55-81103

[51] Int. Cl.$^4$ ...................... H03K 19/21; H03K 17/60
[52] U.S. Cl. ................................... 307/471; 307/311; 307/253
[58] Field of Search ................ 307/311, 471; 361/120, 361/174; 323/269

[56] References Cited

U.S. PATENT DOCUMENTS

| | | | |
|---|---|---|---|
| 3,157,792 | 11/1964 | Low et al. | 307/471 |
| 3,612,847 | 10/1977 | Jörgensen | 307/471 |
| 3,777,180 | 12/1973 | Carlson | 307/471 |
| 4,188,547 | 2/1980 | Fox | 307/471 |

Primary Examiner—Stanley D. Miller
Assistant Examiner—B. P. Davis
Attorney, Agent, or Firm—Schwartz, Jeffery, Schwaab, Mack, Blumenthal & Evans

[57] ABSTRACT

Electronic switching device comprising external terminal means for connecting the switching device with an external power source and with a load, detection circuit means for developing a detection signal, exclusive-or circuit means including a first input terminal connected to the detection circuit means for receiving the developed detection signal and a second input terminal connected to the external terminal means for receiving a low or high input signal therefrom, and output circuit means connected to the exclusive-or circuit means for receiving an output signal generated from the same and for switching the load which is connected to the external terminal means.

12 Claims, 4 Drawing Figures

DUAL ELECTRONIC SWITCHING DEVICE WITH REDUCED EXTERNAL TERMINALS

This application is a continuation of application Ser. No. 597,561, filed Apr. 6, 1984, which is a continuation of application Ser. No. 274,074, filed June 16, 1980, both now abandoned.

BRIEF SUMMARY OF THE INVENTION

This invention relates to an electronic switching device such as a photoelectric switch, a proximity switch, a ultrasonic switch, a logic relay and so on which includes a detection circuit and an output circuit coupled with the detection circuit, and more particularly to an improved switching device which is adapted to perform normally open and normally closed switching actions.

There is well known an electronic switching device which includes a detection circuit for generating a detection signal, a pair of output circuits connected to the detection circuit, and a pair of output terminals respectively connected to the pair of output circuits for connection with a load. One of the output circuits is connected to the detection circuit through an invertor so as to receive an inverted detection signal therefrom. Therefore, when one of the output circuits generates an output signal at the output terminal connected thereto, the opposite output circuit generates a reversed output signal at the output terminal connected thereto. For instance, when there exists an ON signal at one of the output terminals, there exists an OFF signal at the opposite output terminal. Thus, at the respective output terminals, output signals appear in normally open and closed switching action modes. Since such a conventional switching device employs a pair of output circuits, it has the disadvantage that the device is costly in its production and needs relatively large volumetric dimensions. The switching device includes a pair of power source terminals in addition to the output terminals, and has the disadvantage that the device is liable to be manually miswired as to the four terminals.

An electronic switching device also is well known which includes a single output circuit and a manual mechanical switch disposed in the device so that a switching action mode thereof can be selectively obtained with the mechanical switch. Such a switching device also has the disadvantage that it has a low contact reliability and needs large volumetric dimensions.

It is, therefore, a primary object of this invention to provide an electronic switching device which is of a non-mechanical switching construction and has a dual function of normally open and normally closed switching actions with a single output circuit and a reduced number of external terminals.

It is a further object of this invention to provide an electronic switching device which is small in size and economical.

Other objects and advantages of this invention will be apparent upon reference to the following description in conjunction with the accompanying drawings, in which:

DETAILED DESCRIPTION

Figure 1:
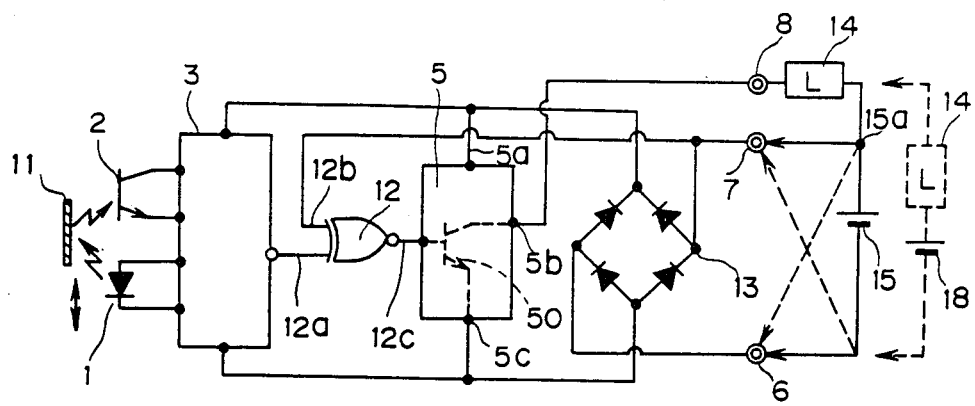
FIG. 1 is a schematic circuit diagram showing an electronic switching device as a preferred embodiment of this invention.

In FIG. 1, there is shown a photoelectric switch, viz. an electronic switching device, as a preferred embodiment of this invention. The device includes a detection circuit 3, an exclusive-or circuit 12, an output circuit 5, a diode bridge circuit 13, and an external terminal means. The terminal means consists of an output terminal 8 for connection to a load 14 and a pair of power input terminals 6 and 7 for connection to a d.c. power source 15. The detection circuit 3 is connected with a light projecting element 1 for projecting light to an object 11 and a light receiving element 2 for receiving reflected light from the object 11 so that when the element 2 receives reflected light from object 11, the circuit 3 may develop a detection signal for application to an input line or terminal 12a of the circuit 12. The other input line or terminal 12b is connected to the power terminal 7 so as to receive a voltage available to the terminal 7. A d.c. power from the source 15 is adapted to be supplied through the diode bridge circuit 13 to the respective detection and output circuits 3 and 5. The terminal 8 is connected to a switching transistor 50 included in the output circuit 5.

The operation of the circuit of FIG. 1 will now be described with reference to the voltage wave forms shown in FIGS. 2A and 2B.

The detection circuit 3 in this embodiment is designed to generate a high output during the existance of the object 11.

Figure 2:
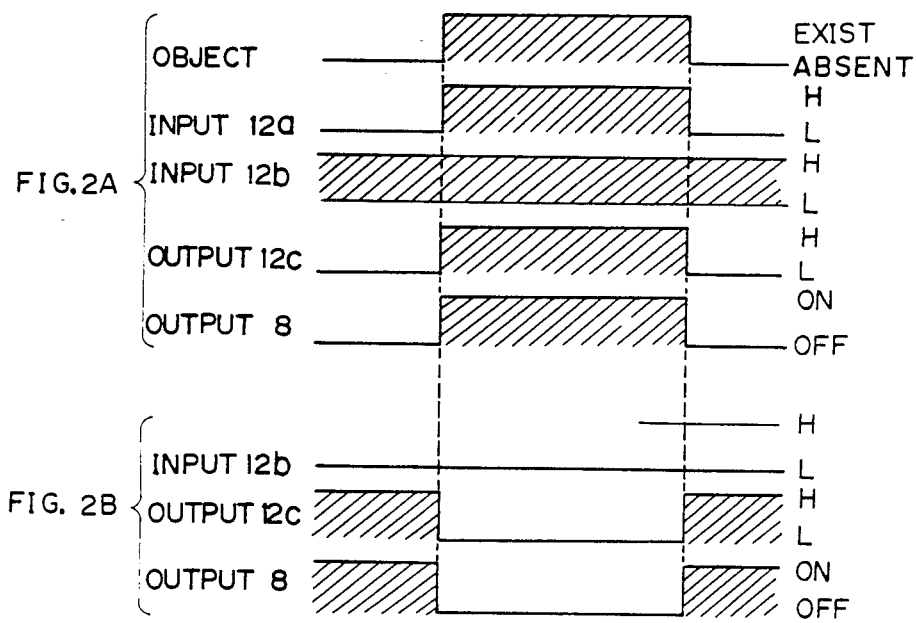
FIGS. 2A and 2B show graphical representations of the voltage wave forms in the device of FIG. 1 during the existance and absence of an object to be detected by the device.

FIG. 2A illustrates the operation of the device of FIG. 1 where a negative power is supplied to terminal 6 and a positive power to terminal 7. During the existence of the object 11, the voltage available to the input line 12a of exclusive-or circuit 12 is kept high. Then, the circuit 12 generates at its output line or terminal 12c a high output which has the same polarity as that of input available to the line 12a, because the input line 12b receives a high voltage all the time. Therefore, during the existence of the object 11, the output circuit 5 generates an ON signal at the output terminal 8 so as to energize the load 14. Then, a load circuit flows through transistor 50 of the output circuit 5. On the contrary, during the absence of the object 11, the output circuit 5 generates an OFF signal at terminal 8, whereby the load 14 connected between terminals 7 and 8 is disenergized.

FIG. 2B illustrates another operation of the device of FIG. 1 in which the d.c. source 15 is reversely connected across the terminals 6 and 7 as illustrated in broken lines of FIG. 1 so that a negative power may be supplied to terminal 7 and a positive power to terminal 6. At the same time, a connecting point 15a between load 14 and source 15 is brought into connection with the terminal 6. Then, a low voltage is applied to the input line 12b and the circuit 12 inverts the input signal applied to the input line 12a so as to generate an inverted output signal. The respective wave forms at lines 12c and 8 of FIG. 2B are reversed with respect to those of FIG. 2A. In FIG. 2B, during the existance of object 11, the circuit 5 generates an OFF output, while during the absence of the object 11, the circuit 5 generates an ON output.

According to this embodiment, by simply changing the direction of connection of the d.c. power source 15 across terminals 6 and 7 with respect to its polarities, the switching action mode of this electronic switching device is changed to a normally open or a normally closed action mode. Moreover, since the device has a single output circuit and has no mechanical switch for changing the switching action modes, it is advantageous for an extremely small miniature switching device and a precise operation device.

The load 14 in this embodiment is at one end thereof connected to the output terminal 8 and at the other end connected to the terminal 7 or 6. Alternatively, the load 14 may be connected in series with another d.c. power source 18 different from the source 15, and connected across the terminals 6 and 8 through the another d.c. power source as shown in broken lines. Then, by simply changing the connection of the source 15 across the terminals 6 and 7 without changing the connection of the load 14, the device of FIG. 1 may be switched to the normally-open or normally-closed switching action mode.

The electronic switching device of FIG. 1 may be modified in such a manner that an output terminal 5b of the circuit 5 is interconnected with a power input terminal 5a so as to allow a load current to flow through the terminal 5a and omit the external terminal 8. The external terminals 6 and 7 are adapted to be connected with the load 14 and the source 15 which are connected in series with each other. According to this modified switching device, the number of external terminals is decreased to only two, and the wiring work for load and d.c. source is further simplified.

Figure 3:
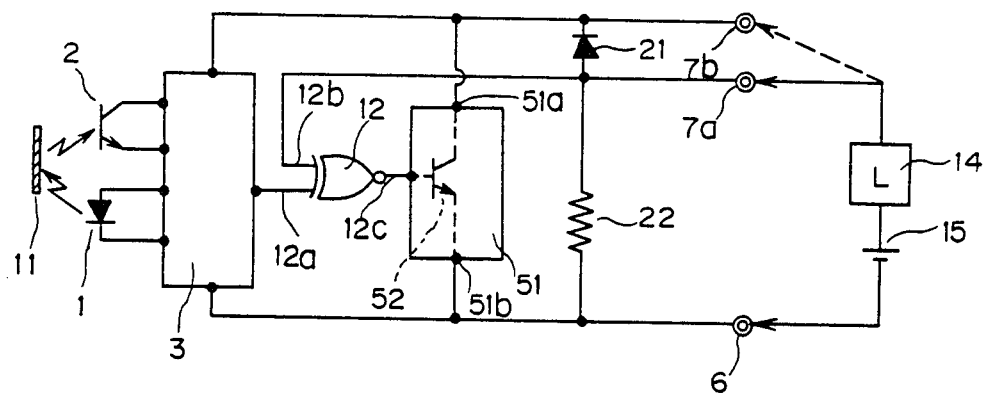
FIG. 3 is a schematic circuit diagram showing a two-wire d.c. electronic switching device as another embodiment of this invention.

In FIG. 3, there is shown a two-wire electronic switching device for switching the series connected load 14 and d.c. power source 15 as another embodiment of this invention. The device includes detection circuit 3, exclusive-or circuit 12, output circuit 51, diode 21 resistance or resistor 22 and three external terminals 6, 7a and 7b.

For ease of understanding, components of FIG. 3 corresponding to components of FIG. 1 are designated with the same reference characters. For instance, circuits 3 and 12 have the same functions as those of the circuits 3 and 12 shown in FIG. 1. The detection circuit 3, of course, may be any other type detection circuit, such as a metal sensing circuit, an ultrasonic sensing circuit, a logic circuit and so on, which develops an output signal for switching the load connected to this device. The output cirucit 51 has the same construction as that of the output circuit of the foregoing modified switching device in the above-mentioned embodiment, which includes a switching transistor 52. The device of this embodiment is designed so that when the detection circuit 3 senses object 11 and the input terminal 12b is kept at a high potential, the transistor 52 is turned on and a sufficient load current flows through load 14.

When the load 14 and source 15 are connected across the terminals 6 and 7a as illustrated in solid lines in FIG. 3, a d.c. power is supplied to the circuits 3 and 51 through diode 21 and the input line 12b is kept at a high potential. Then, during the existence or the absence of the object 11, the load 14 is energized or disenergized in the same manner as the operations described with reference to FIG. 2A.

When the load 14 and source 15 are connected across the terminals 7b and 6 as illustrated in broken lines, d.c. power is supplied directly to the circuits 3 and 51. The input line 12b, however, is kept at a low potential because any high voltage is not applied to the terminal 7a and the line 12b is induced to zero potential by the resistance 22 and the diode 21. Then, during the existance or absence of the object 11, the load 14 is disenergized or energized in the same manner as the operations described with reference to FIG. 2B.

Thus, by simply changing the connection of one end of the series connected external circuit consisting of the load 14 and source 13 between terminals 7a and 7b, the switching device of this embodiment is switched into the normally open or closed switching action mode. Though the device of FIG. 1 needs four large capacity diodes, the device of this embodiment employs a single diode. This is advantageous for a miniaturized switching device with reduced power consumption. The switching device of FIG. 3 may be modified into such a three-wire switching device that the device further includes a specific output external terminal connected to a collector electrode of the transistor 52 for specific connection with the load 14 in the same manner as that of FIG. 1. In the modified device, three wires are connected to three of the four external terminals. A negative electrode of the d.c. source 15 is connected to terminal 6 through a first wire. A positive electrode of the source 15 and one end of the load 14 are commonly connected through a second wire to the terminal 7a or 7b. The other end of the load 14 is connected through a third wire to the specific output external terminal. Therefore, by connecting the second wire to the terminal 7a or 7b, the switching device may be switched into normally open or normally closed switching action mode. The load current of the energized load 14 directly flows from the specific terminal to the circuit 51 without flowing through the doide 21, so that a large capacity is not needed in the diode 21 and the consumption of power by the same is negligible. Therefore, this modified switching device may be reduced to have small dimensions and low power consumption.

Though the switching transistors (50 and 52) in the foregoing embodiments are NPN, the respective devices may by designed so as to employ PNP transistors.

Figure 4:
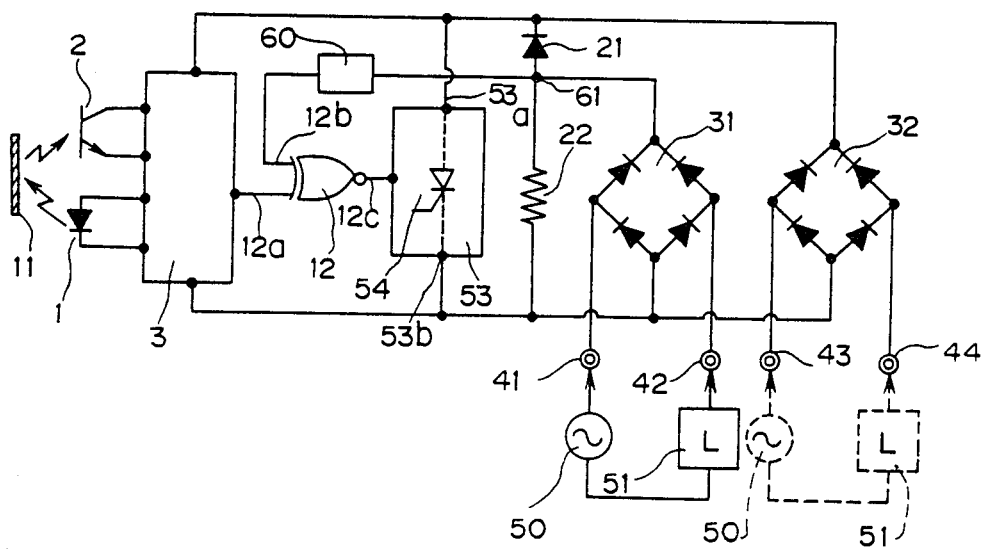
FIG. 4 is a schematic circuit diagram showing a two-wire a.c. electronic switching device as still another embodiment of this invention.

FIG. 4 shows a two-wire a.c. electronic switching device as still another embodiment of this invention. The device includes detection circuit 3, exclusive-or circuit 12, output circuit 53, resistor 22, diode 21, a pair of diode bridge circuits 31 and 32, and two pairs of external terminals 41-and-42 and 43-and-44. A series circuit consisting of an a.c. power source 50 and a load 51 is connected across the terminals 41 and 42 or the terminals 43 and 44. The second input terminal 12b is connected to the circuit 31 through a smoothing circuit 60 which smoothes voltage wave forms of a rectified voltage supplied from the circuit 31 to the circuit 60 so as to supply the input line 12b with a stabilized constant d.c. voltage. The output circuit 53 employs a thyristor 54 which is turned on during the application of an input signal to a gate thereof. The device of FIG. 4 is designed in such a manner that when the detection circuit 3 generates a detection signal in accordance with the existance of object 11 and the input line 12b is kept at a high voltage, the thyristor 54 is turned on.

When the a.c. source 50 and load 51 are connected across terminals 41 and 42, a d.c. power rectified by the circuit 31 is applied to the circuits 3 and 53 through diode 21 and to the input line 12b through the circuit 60. Then, the line 12b is kept at a high voltage, whereby during the existence or absence of the object 11, the load 51 is energized or disenergized in a similar manner to the operations of FIG. 2A. Strictly speaking, during the absence of the object 11, the thyristor 54 is turned off and a small current developed by the circuit 3 flows through the load 51. Such a small current, however, is too small to operate the load 51.

When the a.c. source 50 and the load 51 are connected across the terminals 43 and 44 as illustrated in broken lines, a d.c. power rectified by the circuit 32 is directly applied to the circuits 3 and 53 but is not applied to the line 12b by the diode 21. The potential at connection 61 is induced to zero by the resistance 22 because there is no power supply from the circuit 31. Thus, a low input is applied to the input line 12b and the exclusive-or circuit 12 inverts the input signals applied to the input line 12a. Therefore, during the existence or absence of the object 11, the load 51 is deenergized or energized in a similar manner to the operations of FIG. 2B. Thus, by connecting the series connected load and a.c. source across the terminals 41 and 42 or the terminals 43 and 44, the load is switched by the switching device in normally open or normally closed switching action mode.

The output circuit 53 employs the thyristor 54, but alternatively may employ a switching transistor instead, if desired.

It should be understood that the above description is merely illustrative of this invention and that many changes and modifications may be made by those skilled in the art without departing from the scope of the appended claims.

What is claimed is:

1. An electronic switching device energizable by connection to an external power source, said device being selectively operable in one of a normally open mode and a normally closed mode of operation depending on the connection to said external power source, comprising:

a plurality of external terminals for connection to said external power source and to an external load, said terminals including a first set of selectable terminals for selective connection to an external power source and a load, and a second set of selectable terminals for selective connection to an external power source and a load;

output circuit means for completing an electrical connection between said first or second set of selectable terminals, said output means having an open circuit state and a short circuit state;

logic circuit means connected to said output circuit means for forcing said output circuit means into said short circuit state or said open circuit state, said logic circuit means having two inputs and being responsive to signals received on said two inputs for forcing said output circuit means into one of said short circuit and open circuit states;

detection circuit means for generating a detection signal and supplying said detection signal to one of said inputs of said logic circuit to cause said logic circuit means to force said output circuit means to change from one of said open circuit and short circuit states to the other of said open circuit and short circuit states; and connection means disposed between said external terminals and said logic circuit means for feeding a signal to the other terminal of said logic circuit means to cause said logic circuit means to force said output circuit means normally into said open circuit state or said short circuit state in dependence on the set of selectable terminals chosen for connection to an external power source and a load, said connection means comprising a first polarity lead, means for connecting said first polarity lead to said first set of selectable terminals and said second set of selectable terminals to receive a first polarity voltage from an external power supply through either set of terminals, a second lead connected to said other input of said logic circuit means and to said output circuit, a resistor for connecting said second lead to said first polarity lead, means for connecting said second lead to said first set of selectable terminals for receiving a second polarity voltage when an external power supply is connected to said first set of selectable terminals and for passing current between said output circuit and said first set of selectable terminals; a third lead connected to said output circuit, and means for passing current between said third lead and said second set of selectable terminals, whereby an external power source may be connected to said first set of selectable terminals in series with a load to cause said output means to operate in one of the normally open and normally short circuit states, or can be connected to said second set of selectable terminals in series with a load to cause said output circuit to operate in the other of said normally open and normally short circuit states.

2. An electronic switching device as claimed in claim 1 wherein said plurality of external terminals comprise three terminals, one of said three terminals being a common terminal for connection to a negative pole of a d.c. external power source, said common terminal being included in each of said sets of selectable terminals.

3. An electronic switching device as claimed in claim 2 wherein said means for connecting said first polarity lead to said first set of selectable terminals comprises a wire connected between said first polarity lead and said common terminal.

4. An electronic switching device as claimed in claim 1 wherein said output circuit means comprises a semiconductor switching device having a control terminal connected to said logic circuit means, a second terminal connected to said first polarity lead, a third terminal connected to said third lead, and a diode connected between said second lead and said third lead.

5. An electronic switching device as claimed in claim 4 wherein said diode has an anode connected to said second lead and a cathode connected to said third lead.

6. An electronic switching device as claimed in claim 1 wherein said means for connecting said first polarity lead to said first set of selectable terminals and said second set of selectable terminals, said means for connecting said second lead to said first set of selectable terminals, and said means for passing current between said third lead and said second set of selectable terminals comprise a first rectifier having input terminals connected to said first set of selectable terminals and output terminals connected between said first polarity lead and said second lead, and a second rectifier having input terminals connected to said second set of selectable terminals and output terminals connected between said first polarity lead and said third lead, whereby an alternating current power source can be connected to one of said sets of selectable terminals to operate said switching device in said normally open mode or said normally closed mode of operation.

7. An electronic switching device as claimed in claim 1 wherein said logic circuit means comprises an exclusive-or circuit.

8. An electronic switching device energizable by connection to an external d.c. power source, said device being selectively operable in one of a normally open mode and normally closed mode of operation depending on the polarity of connection of said external d.c. power source, comprising:
   (a) external terminal means for connecting the switching device with said external d.c. power source,
   (b) said external terminal means also connected with a load to provide a normally open or normally closed connection thereto,
   (c) reversible connecting means for reversibly connecting the terminal means to said d.c. power source for providing first and second opposite polarity switch connections corresponding respectively to said normally open mode and normally closed mode of operation,
   (d) detection circuit means for generating a detection signal,
   (e) logic circuit means including a first input terminal connected to said detection circuit means for receiving said generated detection signal and a second input terminal connected to said external terminal means, said logic circuit means being responsive to said reversible connecting means for receiving one of a first or second state of an input signal from said external terminal means corresponding respectively to one of said first and second switch connections of said reversible connecting means, said logic circuit means generating an output signal,
   (f) output circuit means connected to said logic circuit means for receiving said output signal from said logic circuit means and connected to said external terminal means for switching said load in response to said output signal, said output circuit means providing a normally open or normally closed connection to said load corresponding respectively to said first or second switch connection of said reversible connecting means; and
   (g) rectification means connected to said external terminal means for receiving d.c. power from said d.c. power source and providing d.c. bias voltage of a predetermined polarity for said electronic switching device, regardless of the polarity of the connection to said d.c. power source.

9. An electronic switching device as recited in claim 8 wherein said rectification means comprises a diode bridge including a pair of input terminals connected to said external terminal means.

10. An electronic switching device as recited in claim 8 wherein said external terminal means comprises a pair of d.c. power input terminals, and said logic circuit means comrpises an exclusive-or circuit, said first and second input terminals of said logic circuit means being connected to said exclusive-or circuit, and said second input terminal being connected to one of said power input terminals.

11. An electronic switching device as recited in claim 8 wherein said rectification means comprises a diode bridge including a pair of input terminals connected to said power input terminals, and a pair of output terminals connected to at least one of said detection circuit means and said output circuit means to supply said d.c. bias voltage thereto.

12. An electronic switching device as recited in claim 8 wherein said logic circuit means comprises an exclusive-or circuit.

* * * * *